United States Patent [19]

Grandmont et al.

[11] Patent Number: 5,302,494

[45] Date of Patent: Apr. 12, 1994

[54] MULTILAYER CIRCUIT BOARD HAVING MICROPOROUS LAYERS AND PROCESS FOR MAKING SAME

[75] Inventors: Paul E. Grandmont, Cumberland, R.I.; Harold Lake, Sharon; Richard A. Anderson, Attleboro, both of Mass.

[73] Assignee: The Foxboro Company, Foxboro, Mass.

[21] Appl. No.: 915,341

[22] Filed: Jul. 17, 1992

Related U.S. Application Data

[60] Division of Ser. No. 429,139, Oct. 30, 1989, abandoned, which is a continuation-in-part of Ser. No. 742,747, Jun. 10, 1985, Pat. No. 4,915,983.

[51] Int. Cl.⁵ .............................................. G03C 5/00
[52] U.S. Cl. .................................... 430/325; 430/272; 430/278; 430/271; 430/276; 430/311; 430/279; 430/260; 430/261; 430/273; 430/503
[58] Field of Search ............... 430/325, 272, 278, 271, 430/276, 311, 279, 260, 261, 273, 503

[56] References Cited

U.S. PATENT DOCUMENTS

| | | |
|---|---|---|
| 3,922,479 | 11/1975 | Older et al. . |
| 4,157,407 | 6/1979 | Pheiffer . |
| 4,278,752 | 7/1981 | Gervay et al. . |
| 4,283,243 | 8/1981 | Andreades et al. . |
| 4,469,777 | 9/1984 | O'Neill . |
| 4,554,229 | 10/1985 | Small . |
| 4,597,828 | 7/1986 | Tadros . |
| 4,642,160 | 2/1987 | Burgess . |
| 4,666,818 | 5/1987 | Lake et al. . |
| 4,774,279 | 9/1988 | Kohm . |
| 4,859,571 | 8/1989 | Cohen et al. ................... 430/272 |
| 4,915,983 | 4/1990 | Lake et al. . |
| 4,954,185 | 9/1990 | Kohm . |
| 5,015,553 | 5/1991 | Grandmont et al. ............ 430/260 |

FOREIGN PATENT DOCUMENTS

| | | |
|---|---|---|
| 0259812 | 9/1987 | European Pat. Off. . |
| 0270945 | 11/1987 | European Pat. Off. . |
| 0273374 | 7/1988 | European Pat. Off. . |
| 3525416A1 | 1/1986 | Fed. Rep. of Germany . |

OTHER PUBLICATIONS

Mathotra et al., Hewlett-Packard Journal (Aug./83).

Primary Examiner—John Kight, III
Assistant Examiner—Duc Truong

[57] ABSTRACT

A microporous, photoprocessable, moderately hydrophilic material on which metal can be deposited directly using electroless plating techniques, and its use in preparing printed wiring boards and circuit components.

45 Claims, 3 Drawing Sheets

MULTILAYER CIRCUIT BOARD HAVING MICROPOROUS LAYERS AND PROCESS FOR MAKING SAME

This is a divisional of copending application Ser. No. 07/429,139, filed Oct. 30, 1989, now abandoned, which is a continuation in part of Lake et al., U.S. Ser. No. 742,747, entitled "Multilayer Circuit-Board Fabrication Process", filed Jun. 10, 1985, now U.S. Pat. No. 4,915,983 assigned to the assignee of the present application and incorporated by reference herein in its entirety.

BACKGROUND OF THE INVENTION

This invention relates to manufacturing printed wiring boards and electrical components.

Printed wiring boards (PWB) perform several indispensable functions in electronic devices of all kinds. First, individual electrical components, e.g., specially packaged integrated circuits, resistors, etc., are mounted or carried on the surface of the flat, usually sturdy, card-like board. Thus, the PWB serves as a unitary mechanical support for the components. Secondly, using chemically etched or plated conductor patterns on the board's surface, the PWB forms the desired electrical connections between the components. Furthermore, the PWB often includes metal areas serving as heat sinks for high power or thermally sensitive components.

As the use of integrated circuits has grown, the higher density of connections between components has necessitated double-sided PWB's in which additional interconnections are made employing conductor patterns on the other side of the board. This trend has been extended to boards having many layers of interconnections called multilayer PWB'S. Connections from layer to layer are typically made by plated-through holes.

Conductor patterns can be formed using either subtractive or additive processes. In a typical subtractive process, a photoresist layer is applied to the copper foil portion of a copper foil-clad epoxy fiberglass substrate and patterned by exposure to ultraviolet light through a stencil-like film artwork mask. The exposed areas of the photoresist are polymerized. The unexposed, unpolymerized areas are removed by a chemical developing solution, leaving areas of copper having the desired conductor pattern underneath the protective barrier of the remaining polymerized photoresist. The exposed copper is then electroplated or etched away (i.e. "subtracted") and the remaining photoresist removed to expose the conductor pattern.

An additive process for forming the conductor pattern starts with an insulating substrate, typically a plastic laminate, throughout which is dispersed a catalyst capable of initiating metal plating on the substrate; typical catalysts are palladium-based materials. The catalytic substrate, referred to as a "fully additive base material," is coated with photoresist and the photoresist is patterned as described above. The holes through the resist formed when the unpolymerized resist is washed away are then filled with metal using electroless plating techniques. Since the conductors are produced by the addition of metal, rather than subtraction as in etching, the process is called "additive".

To promote adhesion between the plated metal and the substrate, the substrate typically is coated with a catalytic adhesive prior to application of the photoresist. The adhesive is usually a resin blend containing the plating catalyst and a colloidal suspension of rubber. The adhesive is treated with a strong etchant which primarily attacks the rubber component, etching it almost entirely. This treatment creates catalytic micropores in the adhesive that promote adhesion between the plated metal and the substrate surface.

In addition to the fully additive base material described above, semi-additive base materials, which are also adhesive-coated, can be used as the substrate material. Both the semi-additive material and its adhesive lack the dispersed catalyst. They are rendered microporous as described above and then immersed in a solution containing a precursor for the catalyst. The precursor is subsequently activated to expose catalytic sites for the plating operation.

SUMMARY OF THE INVENTION

In general, the invention features in a first aspect a composition of matter that includes a catalytically seeded, photoprocessable, moderately hydrophilic material. In preferred embodiments, the wetting tension of the material (a measure of its hydrophilicity/hydrophobicity) is at least 52 dynes/cm as determined according to the method set forth in ASTM D2578-67. The preferred material includes an ethylenically unsaturated monomer, a polymerization initiator activatable by actinic radiation, at least one preformed, water-soluble, polymeric binder, and a particulate inorganic filler transparent to actinic radiation (which preferably is bonded to the binder). It is preferably seeded by coating the filler particles with catalyst or by adding finely divided palladium or palladium chloride catalyst seeds.

In a second aspect, the invention features a printed wiring board that includes a circuit layer made of a first material and a via layer made of a second material different from the first material. In preferred embodiments, the via layer includes a cured microporous photopolymer which is preferably moderately hydrophilic (with a wetting tension of at least 52 dynes/cm), e.g., the polymerized product of an ethylenically unsaturated monomer, a polymerization initiator activatable by actinic radiation, at least one preformed, water-soluble, polymeric binder, and a particulate inorganic filler transparent to actinic radiation in which the filler particles are chemically bonded to the binder. The micropores are preferably fractal micropores.

Another preferred via layer includes two layers of a cured microporous photopolymer separated by a layer of woven fabric. The woven fabric preferably is capable of bonding to the photopolymer and has a refractive index that substantially matches the refractive index of the photopolymer. The thickness of the upper layer of the photopolymer preferably is less than the diameter of the micropores.

The circuit layer of the printed wiring board preferably includes a cured moderately hydrophobic photopolymer whose wetting tension is less than 40 dynes/cm. The preferred photopolymer includes the polymerized product of a monomer which is a half acryloyl ester of bisphenol A epoxy monomer, a polymerization initiator activatable by actinic radiation, and at least one preformed elastomeric polymeric binder that is substantially free of acidic groups. The photopolymer preferably contains an acrylated urethane as well.

In a third aspect, the invention features a process for preparing the above-described printed wiring board (as well as boards in which the via and circuit layers are made of the same material) that includes the steps of forming a microporous via layer from a photoprocessable material; forming a circuit layer on the via layer; and contacting the via and circuit layers with a metal plating solution under reaction conditions sufficient to deposit metal on the portions of the via layer (but not the circuit layer) exposed to the plating solution.

In preferred embodiments, the via layer is mass-seeded with catalyst particles capable of initiating metal plating prior to formation of the circuit layer or selectively seeded with the catalyst particles subsequent to formation of the circuit layer. Where the photoprocessable material forming the via layer contains filler particles, seeding may be accomplished by coating the filler particles with catalyst prior to formation of the micropores.

One preferred way of forming the micropores in the via layer involves overlaying the photoprocessable material with a mask having a plurality of dots, the diameter of the dots being selected to create micropores having a predetermined diameter; exposing the photoprocessable material through the mask to a source of radiation; and developing the exposed areas of the photoprocessable material to create the micropores. The dots preferably have diameters between 5 and 30 microns and centers between 12 and 60 microns. The mask preferably further includes a via pattern whereupon the exposure and development steps simultaneously create vias and micropores in the photoprocessable material.

A second preferred method for forming the micropores involves preparing a digital representation of a pattern that includes a plurality of dots, the diameter of said dots being selected to create micropores having a predetermined diameter; applying a layer of unexposed, undeveloped photographic imaging film to the photoprocessable material that is sensitive to a different spectrum of energy from the photoprocessable material or is differentially sensitive to the same spectrum of energy; selectively exposing the film with an automatic photoplotter controlled by the digital representation to activate the film without affecting the underlying layer of photoprocessable material; developing the film; exposing the photoprocessable material through the image developed in the film as an in situ mask; and developing the exposed areas of the photoprocessable material to create the micropores. As described above, the diameter of each dot preferably is about 5 microns. The pattern preferably further includes a via pattern so that the imaging and development steps simultaneously create vias and micropores in the photoprocessable material.

In other preferred embodiments, the via layer is treated with a reactive coupling agent to chemically bond the agent to the surface of the via layer. Examples of preferred coupling agents include organotitanates, organozirconates, and organosilanes, used alone or in combination with each other. Preferably, the coupling agent is capable of catalyzing the deposition of metal on the exposed portions of the via layer.

In a fourth aspect, the invention features an electroless plating process that includes contacting a catalytically activated layer of a microporous photoprocessable material deposited on a substrate with a metal plating solution under reaction conditions sufficient to deposit metal on the portions of the layer exposed to the plating solution.

In one preferred embodiment, the catalytically activated layer is prepared by creating micropores in a layer of photoprocessable material deposited on a substrate; curing the layer; and then seeding the layer with a catalyst capable of initiating metal plating. In another preferred embodiment, the catalytically activated layer is prepared by incorporating a catalyst in a photoprocessable material and then creating micropores in the material. Preferred photoprocessable materials and methods for creating the micropores are as described above.

In a fifth aspect, the invention features an electroless plating process that includes the steps of treating the surface of a photoprocessable material with a reactive coupling agent to chemically bond the photoprocessable material to the coupling agent; and treating the photoprocessable material with a metal plating solution under reaction conditions sufficient to deposit metal on the portions of the photoprocessable material exposed to the plating solution. Preferred coupling agents are as described above.

The invention also features a circuit component (e.g., an inductor) fabricated from a microporous photoprocessable material.

The invention provides printed wiring boards in which metal plating adheres tenaciously and selectively to the via layers and not in the circuit layer surfaces. The use of a microporous photoprocessable material in the via layers makes board manufacture simple and safe by allowing metal to be plated directly onto the material and by avoiding the need for special adhesives that must be treated with strong, toxic, environmentally hazardous etchants. Furthermore, multilayer boards can be fabricated because the problems of plating bath contamination and etching of already plated metal associated with the use of strong etchants are avoided. Devices made of the microporous material are lightweight and efficient.

Other features and advantages of the invention will be apparent from the following description of the preferred embodiments thereof, and from the claims.

DESCRIPTION OF THE PREFERRED EMBODIMENTS

We first briefly describe the drawings.

DETAILED DESCRIPTION

Figure 1:
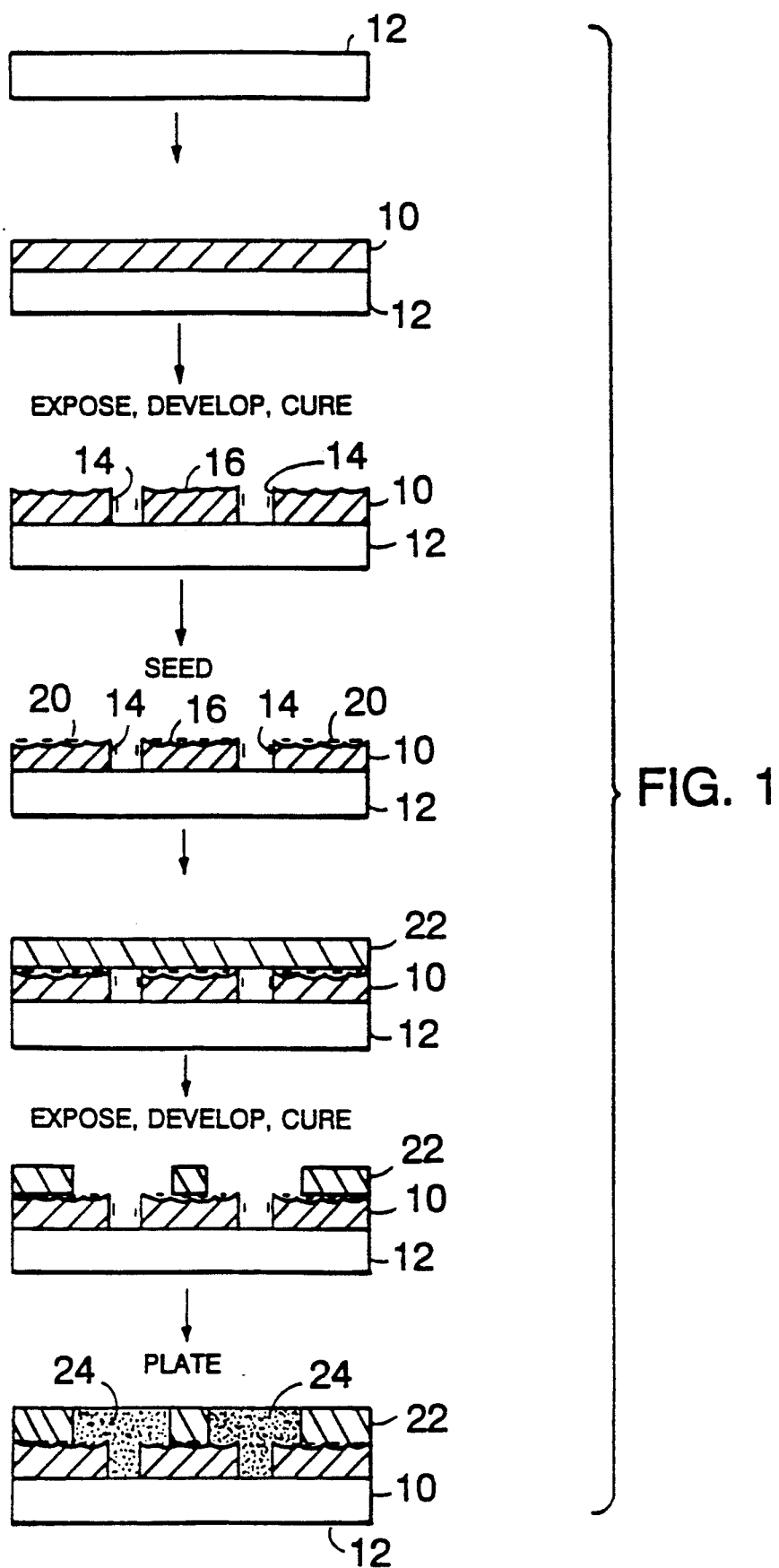
FIG. 1 is a diagrammatic cross-sectional view of the sequential construction of a multilayer printed wiring board fabricated using mass seeding.

Referring to FIG. 1, the first step in constructing a representative single-sided printed wiring board (PWB) using mass seeding is to hot-roller laminate a layer 10 of photoprocessable material approximately 0.0015 inch thick on a copper plate 12 approximately 0.062 inch thick. The preferred photoprocessable material is an aqueous-processable, moderately hydrophilic, dry film photopolymerizable composition as disclosed in Tecle et al., European Patent Application No. 87113013.4 published Mar. 16, 1988 (hereby incorporated by reference). This composition consists of an ethylenically unsaturated monomer, an initiator activatable by actinic radiation, at least one preformed, water-soluble, polymeric binder, and particles of an inorganic material transparent to actinic radiation which are chemically bonded to the binder. It has a wetting tension of at least 52 dynes/cm (e.g., 52-56 dynes/cm) as measured according to ASTM D2578-67. The wetting tension is an indication of the hydrophilicity/hydrophobicity of the material; the higher the wetting tension the more hydrophilic the material is.

As disclosed in Tecle et al., preferred fillers are silica, silicate, alumina, or carbonate particles (or derivatives thereof) in which at least 95% of the particles have diameters between 0.1 and 15 microns. Preferred binders include Carboset 525 (methylmethacrylate/ethyl acrylate/-acrylic acid), Blendex 491, Lucite 47 KNL, Amphomer amphoteric pentapolymer (tert-octyl-acrylamide/methyl methacrylate/-hydroxypropylmethacrylate/tertbutylaminoethyl methacrylate/acrylic acid) acrylic binder, and PVP K-90 (polyvinylpyrrolidone). Examples of preferred monomers include acrylate, diacrylate, and triacrylate monomers, e.g., pentaerythritol triacrylatd and trimethylol propane triacrylate, which may be used alone or in combination with each other. Preferred initiators are free radical generating addition polymerization initiators activatable by actinic light, e.g., benzophenone, Micbler's ketone, diethyl hydroxylamine, and 3-mercapto-1,2,4-triazole.

A series of vias and micropores is formed in layer 10 using the methods described in Lake et al., U.S. Pat. No. 4,666,818 entitled "Method of Patterning Resist" and Lake et al,, U.S. Ser. No. 006,624 filed Jan. 22, 1987 (which is a continuation in part of Lake et al. '818) entitled "Method of Patterning Resist", both of which are assigned to the same assignee as the present application and are hereby incorporated by reference in their entirety. According to these imaging methods, a thin, unexposed, undeveloped strip base silver or other photoimageable film (not shown) is placed over layer 10. This film and layer 10 are either sensitive to different energy spectra or show differential sensitivity to a single spectrum such that exposure of one does not affect the other. The film is then exposed using a white light x-y photoplotter driven by a computer aided design (CAD) system to create a pattern of vias for ground pick-up (the diameter of each via being approximately 0.005 inch) and an entire field of small dots for creating micropores. The actual dot pattern (and thus the micropore pattern) is selected based upon the minimum feature size to be anchored. For lines of 25 microns or greater, the diameter of each dot is between 5 and 30 microns and the dots are regularly spaced on approximately 12-60 micron centers. The exposed film is then developed to expose areas of layer 10 according to the above-described pattern. These areas are then exposed to ultraviolet (U.V.) light (approximately 150 millijoules/cm² at 365 nm). Following U.V. exposure, the film is peeled off and layer 10 is spray developed in a 1% sodium carbonate monohydrate solution at 40° C. or a 0.75% monoethanolamine solution at 30° C. for about 1 minute, water ringed, and dried.

Figure 2:
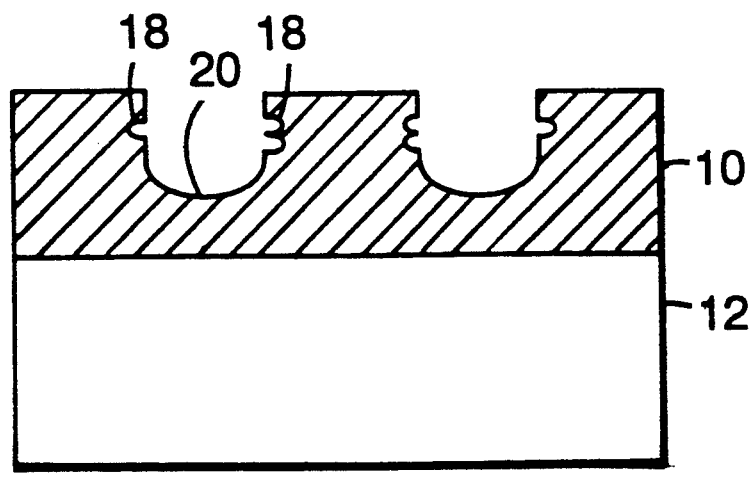
FIG. 2 is a cross-sectional view of a fractal micropore.

The resulting layer has a series of completely washed out via holes 14 extending down to copper ground plane support 12. It also exhibits a series of micropores 16 corresponding to areas of layer 10 exposed through the dots in the film. Each micropore is washed out to a depth of about 5-6 microns. Within each micropore, there exists a series of secondary micropores 18 (FIG. 2) formed when unreacted photopolymer washes out and filler particles remain in the walls of the micropore during development; the resulting "micropore within a micropore" structure is referred to as a fractal micropore. The micropore structure is also a result of light scattering during exposure. The top and inner surfaces of these micropores have a fine, matte surface for anchoring catalytic plating seeds and plated metal to layer 12.

Following development, layer 10 is exposed to U.V. at 0.5 joules/cm² and then baked at 300° F. for 1 hour, followed by a second U.V. exposure at 4-5 joules/cm². It has been found that this cure process retains micropore integrity more effectively than a full U.V. cure followed by baking (which causes embrittlement) or baking prior to any U.V. exposure (which causes the resist to flow and fill the micropores). The composite structure formed by layers 10 and 12 is then immersed in a series of conventional cleaning and catalyst seeding solutions, rinsed, and dried to deposit catalytic seeds 20 for plating in the, micropores.

Next, circuit layer 22 is created by hot roller laminating a layer of a moderately hydrophobic photoprocessable dry film. The preferred material is disclosed in Gervay, European Patent Application No. 87117547.7 published Jun. 15, 1988 (hereby incorporated by reference) and consists of a monomer which is a half acryloyl ester of bisphenol A epoxy monomer, a polymerization initiator activatable by actinic radiation, and at least one preformed elastomeric polymeric binder that is substantially free of acidic groups (e.g., the number of acidic groups is sufficiently low such that the composition can withstand contact for 24 hours to a liquid at a pH of 12 maintained at a temperature of 70° C.; an example of such a liquid is an electroless plating bath liquid composition described on page 7-6 of "Printed Circuits Handbook" Second Edition, ed. by Clyde F. Coombs, Jr., McGraw-Hill Book Co., 1979). It may also include an acrylated urethane, as well as dyes, pigments, fillers, and thermal polymerization inhibitors. It has a wetting tension of less than 40 dynes/cm (e.g., between 35-40 dynes/cm).

As disclosed in Gervay, preferred monomers have the formula

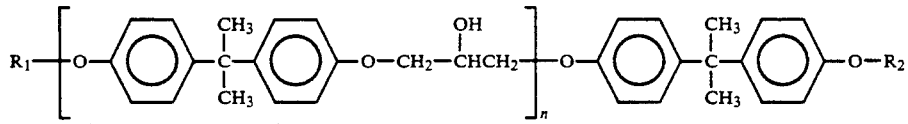

where
$R_1$ is

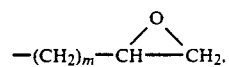

$R_2$ is

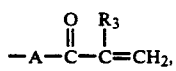

R₃ is H or an alkyl group having between 1 and 10 carbon atoms, inclusive,

A is

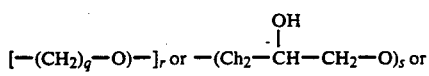

-A- represents a linkage between 0 and

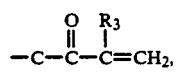

and

M, q, r, and s, independently, are integers from 1 to 10 and n is zero or an integer from 1 to 5.

Preferred binders include the elastomers described on page 232 of "Hackh's Chemical Dictionary" Fourth Edition, ed. by J. Grant, McGraw-Hill Book Co. 972. The binders are water-insoluble, e.g., they will not dissolve in water at room temperature during 4 hours. Examples of preferred binders include methylmethacrylate/butadiene/styrene terpolymer (e.g., Acryloid BTA-IIIs and BTA-IIIN2 commercially available from Rohm and Haas). Preferred initiators are free radical generating addition polymerization initiators activatable by actinic light, e.g., benzophenone, Michler's ketone, diethyl hydroxylamine, and 3-mercapto-1,2,4-triazole. Preferred urethanes include conventional, commercially available products such as CMD-6700, Chempol-19-4827, and Gafguard-238 present in an amount of 0 to 30 parts by weight.

The thickness of layer 22 is about 0.0012 inch. Layer 22 is overlaid with a mask having the desired circuit and ground pick-up pattern, exposed to approximately 250 millijoules/cm² of U.V. light through the mask, and developed in 1,1,1-trichloroethane for about 1 minute at 25° C. Following development, the circuit pattern washes out completely down to the seeded microporous layer. Next, layer 22 is baked at 300° F. for 30 minutes, followed by flood exposure to U.V. light (2.5 joule/cm² at 365 nm) to fully cure it.

Following cure, the prepared substrate is chemically cleaned and then strike plated in a conventional electroless copper plating bath of the type commonly used for depositing copper in plated through holes. After about 40–80 microinches of copper have been deposited on microporous layer 10 and in the vias, the substrate is removed from the bath and transferred to a full build, high quality electroless copper plating bath of the type commonly used for fully additive plating of printed circuit boards. When the resulting electroless copper deposit 24 has plated flush to the surface of circuit layer 22, the substrate is removed from the plating bath. Vias from the ground plane layer 12 are formed and connected to circuit layer 22, as defined by the circuit pattern.

The above-described process is repeated as many times as necessary to create a printed wiring board having the desired number of circuit and via layers. The second circuit layer will interconnect to the first circuit layer through vias washed out of the microporous Vacrel layer down to copper metal sites on the first circuit layer according to the circuit pattern.

Figure 3:
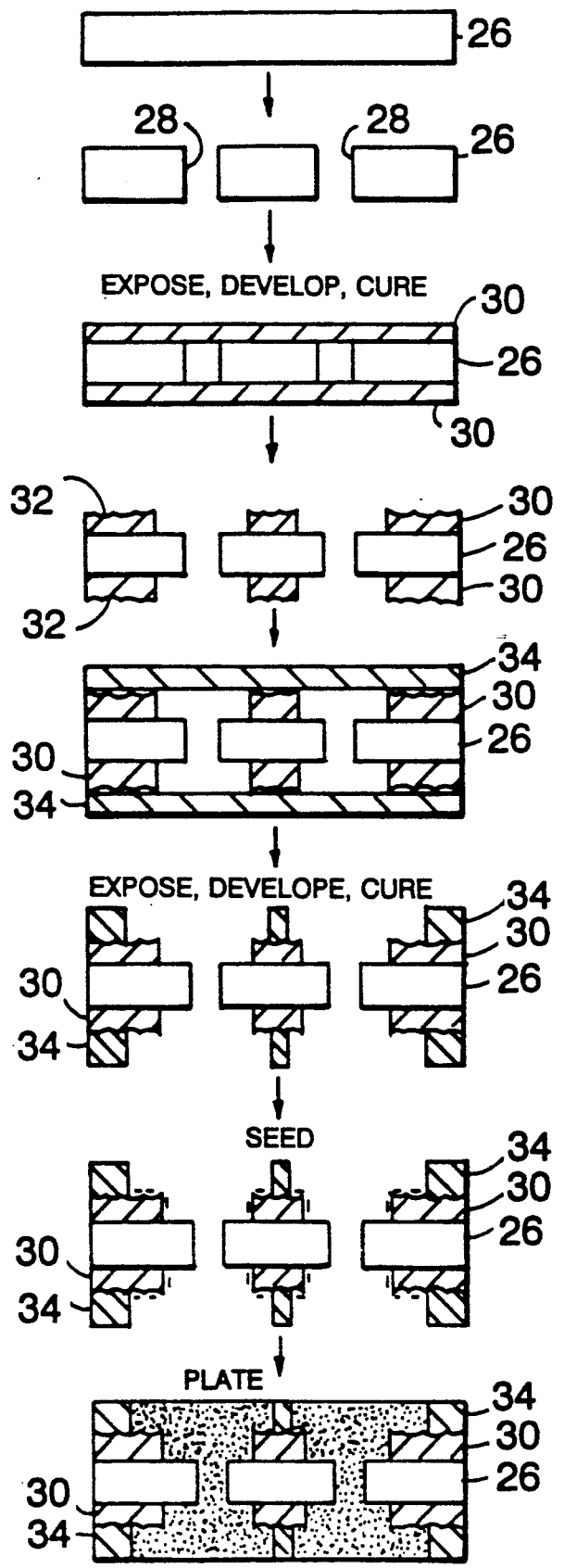
FIG. 3 is a diagrammatic cross-sectional view of the sequential construction of a multilayer printed wiring board fabricated using selective seeding.

FIG. 3 illustrates the preparation of a multilayered printed wiring board using selective seeding. In this process, the catalyst seeds are added separately, rather than forming an integral part of the insulating substrate. An advantage of selective seeding is improved retention of the substrate's insulating properties upon exposure to conditions of high temperature and humidity because conductive anodic filamentation is minimized.

Referring to FIG. 3, a 0.030 inch glass-epoxy unclad type FR-4 substrate 26 is drilled for plated through hole interconnects 28. The drilled holes have diameters between 0.007 and 0.015 inch. Substrate 26 is then cleaned, surface-prepped, and hot roller laminated on both sides with a photopolymer 30 having the composition disclosed in Tecle et al. described earlier for the mass seeding case (each layer being about 0.0015 inch thick).

Next, each photopolymer layer is overlaid with a thin silver or other photo-imageable film (not shown) as described above for the mass seeding process and the film exposed with the CAD-driven photoplotter and then developed to create a pad pattern identical to the drilled hole pattern and an entire field of small dots, teach about 0.0002 inch (5 microns) in diameter spaced on approximately 0.0005 inch (12 microns) centers. The photopolymer layers are then exposed through the films to U.V. light (about 150 millijoules/cm² at a wavelength of 365 nm), Following removal of the films, the photopolymer layers are spray-developed in a 1% sodium carbonate monohydrate solution at 40° C. or 0.75% monoethanolamine solution at 30° C. for about one minute, rinsed with water, and dried. The resulting microporous surfaces have completely washed out via holes superimposed over the drilled holes in the substrate with the 5–30 micron diameter micropores 32 washed out to a depth of about 5–6 microns. The top and inner surfaces of the washed out micropores have a fine matte surface because these micropores are fractal micropores, as described above for the mass seeded process. The photopolymer layers are then exposed to U.V. at 0.5 joules/cm², baked at 300° F. for 1 hour, and then exposed to U.V. at 4–5 joules/cm².

The next step is to hot roller laminate each photopolymer layer with a 0.0012 inch thick layer 34 of the moderately hydrophobic photopolymer disclosed in Gervay and described earlier for the mass seeding case. These layers are then overlaid with masks having the desired circuit and via pickup patterns for each side, exposed to about 250 millijoules/cm² of U.V. light at 365 rim through the masks, and spray developed in 1,1,1-trichloroethane for about one minute at 25° C. Upon development, the desired circuit and via pickup patterns wash out completely down to the microporous surfaces. The substrate is then baked at 300° F. for 30 minutes followed by flood exposure to U.V. light (2.5 joules/cm² at 365 rim) on both sides.

Following the U.V. flood exposure, the substrate is immersed in a series of cleaning and catalysing solutions to deposit catalytic seeds 35 for initiating metal plating in the micropores. Catalyst is selectively deposited in the micropores due to the hydrophilic nature of the via layer (to which the seeding solution is attracted) and the hydrophobic nature of the circuit layer (which repels the seeding solution). The selectively seeded substrate is then rinsed and immersed in an electroless copper strike bath of the type commonly used for copper deposition in plated through holes. After approximately 40–80 micro-inches of copper is plated in the through holes and exposed microporous surfaces, the substrate is removed and transferred to a high quality, full build electroless copper plating bath of the type commonly used for fully additive plating of printed circuit boards. The substrate is removed when the copper is plated flush to the surfaces of the moderately hydrophobic photopolymer.

The above-described process is repeated as many times as necessary to create a printed wiring board having the desired number of circuit and via layers. The outer circuit layers will interconnect to the inner circuit layers through vias washed out of the microporous Vacrel layers according to the circuit pattern.

Other embodiments are within the following claims.

Figure 4:
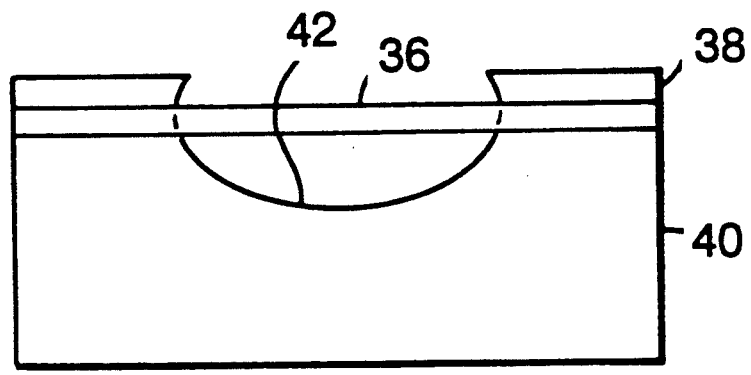
FIG. 4 is a cross-sectional view of a microporous material having a woven mesh interposed between two layers of photoprocessable material.

For example, referring to FIG. 4, a finely woven cloth 36 (e.g., made of fiberglass) may be inserted between two layers of photopolymer (e.g., the moderately hydrophilic photopolymer of Tecle et al.) 38, 40. During processing, the weave is uncovered, thereby providing discrete reinforcement and a uniform number of locking bond sites for anchoring catalyst seeds to ensure uniform adhesion of metal plating no matter where holes are photoformed and filled with metal. The weave also helps control thermal expansion, thus making the board more failure resistant. Preferably, the weave is made of a bondable material having a refractive index matching that of the photopolymer to minimize bloom and scattering. The top photopolymer layer 38 preferably is thinner than the diameter of the micropore 42 formed upon U.V. exposure and development so that the pores will fully wash out when processed. This ensures that the cross weave bonding sites are properly exposed for plating.

The surface of the woven fabric can also be pretreated with a reducing agent, e.g., palladium chloride or colloidal palladium solutions, prior to insertion between the photopolymer layers. This would autocatalyze the plating process and ensure an excellent bond between the plated metal and the photopolymer layer.

Instead of using mass seeding or selective seeding techniques, the filler particles of the microporous photoprocessable material can be coated with catalyst during initial fabrication of the photoprocessable material prior to micropore formation.

Micropores and vias can be formed in the photoprocessable material by exposing the material through a mask having a pattern of vias and holes for forming the micropores, rather than using the CAD-directed photoplotter in combination with the thin silver film. Similarly, the circuit layer can be imaged using the CAD-directed photoplotter in combination with the thin silver film, rather than a mask.

Circuit components such as inductors can be prepared from the microporous material using the methods described in Williams, U.S. Ser. No. 212,143 filed Jun. 27, 1988 entitled "Multilayer Electrical Coil" which is assigned to the same assignee as the present application and hereby incorporated by reference in its entirety.

Adhesion of plated metal to the via layer (which may or may not be microporous) can also be promoted by treating the surface of the layer with a reactive coupling agent prior to final cure, e.g., by using the agent as the developing solution or by immersing the via layer in a water solution of the agent after development, followed by a rinse. The subsequent U.V. and thermal cure chemically bonds the agent to the surface, where it can then act to promote adhesion of subsequently plated metal. The coupling agent may also act as a catalyst for metal plating at the same time. Examples of suitable coupling agents include organotitanates (e.g., titanium triethanolamine and diethanolamine commercially available from DuPont as Tyzor TE and Tyzor DEA, respectively), organozirconates (e.g., zirconium ethylene diamine commercially available from DuPont as Tyzor 212), and organosilanes (e.g., methacryloxypropyltrimethoxysilane and aminopropyltriethoxysilane, both of which are commercially available from Petrarch Chemicals as Petrarch M8550 and AP750, respectively).

We claim:

1. An electroless plating process comprising contacting a catalytically activated layer of a microporous photoprocessable material prepared by creating micropores in the photoprocessable material and deposited on a substrate with a metal plating solution under reaction conditions sufficient to deposit metal on the portions of said layer exposed to said plating solution.

2. The process of claim 1 wherein said catalytically activated layer is prepared by
    creating micropores in a layer of photoprocessable material deposited on a substrate;
    curing the layer of microporous photoprocessable material; and
    seeding said layer with a catalyst capable of initiating metal plating.

3. The process of claim 1 wherein said catalytically activated layer is prepared by
    incorporating a catalyst in a photoprocessable material; and
    creating micropores in said material.

4. The process of claim 1 wherein said photoprocessable material comprises an ethylenically unsaturated monomer, a polymerization initiator activatable by actinic radiation, at least one preformed, water-soluble, polymeric binder, and a particulate inorganic filler transparent to actinic radiation.

5. The process of claim 4 wherein said filler is chemically bonded to said binder.

6. The process of claim 1 wherein said micropores are created by
    overlaying said photoprocessable material with a mask having a plurality of dots, the diameter of said dots being selected to create micropores having a predetermined diameter;
    exposing said photoprocessable material through said mask to a source of radiation; and
    developing the exposed areas of said photoprocessable material to create said micropores.

7. The process of claim 1 wherein said micropores are created by
    preparing a digital representation of a pattern comprising a plurality of dots, the diameter of said dots being selected to create micropores having a predetermined diameter;
    applying a layer of unexposed, undeveloped photographic imaging film to said photoprocessable material that is sensitive to a different spectrum of energy from said photoprocessable material or is differentially sensitive to the same spectrum of energy;
    selectively exposing said film with an automatic photoplotter controlled by said digital representation to activate said film without affecting, the underlying layer of photoprocessable material;
    developing said film;

exposing said photoprocessable material through the image developed in said film as an in situ mask; and developing the exposed areas of said photoprocessable material to create said micropores.

8. The process of claim 1 wherein said micropores are fractal micropores.

9. An electroless plating process comprising the steps of treating the surface of a photoprocessable material with a reactive coupling agent to chemically bond said photoprocessable material to said coupling agent; and treating said photoprocessable material with a metal plating solution under reaction conditions sufficient to deposit metal on the portions of said material exposed to said plating solution.

10. The process of claim 9 wherein said coupling agent comprises an organotitanate, organozirconate, organosilane, or a combination thereof.

11. The process of claim 9 wherein said coupling agent is capable of catalyzing the deposition of metal on the exposed portions of said photoprocessable material.

12. A process for creating a microporous photoprocessable material comprising the steps of imaging a photoprocessable material by exposing said material to a source of radiation to form a pattern of exposed areas comprising a plurality of dots, the diameter of said dots being selected to create micropores having a predetermined diameter in said photoprocessable material; and developing the exposed areas of said photoprocessable material to create micropores.

13. The process of claim 12 wherein said micropores are created by overlaying said material with a mask having a plurality of dots, the diameter of said dots being selected to create micropores having a predetermined diameter in said photoprocessable material;

exposing said photoprocessable material through said mask to a source of radiation; and developing the exposed areas of said photoprocessable material to create micropores.

14. The method of claim 13 wherein said micropores are created by preparing a digital representation of a pattern comprising a plurality of dots, the diameter of said dots being selected to create micropores having a predetermined diameter;

applying a layer of unexposed, undeveloped photographic imaging film to said photoprocessable material that is sensitive to a different spectrum of energy from said photoprocessable material or is differentially sensitive to the same spectrum of energy;

selectively exposing said film with an automatic photoplotter controlled by said digital representation to activate said film without affecting the underlying layer of photoprocessable material;

developing said film;

exposing said photoprocessable material through the image developed in said film as an in situ mask; and developing the exposed areas of said photoprocessable material to create said micropores.

15. The process of claim 12 wherein the dots have diameters ranging from 5 to 30 microns and centers ranging from 12 to 60 microns.

16. The process of claim 12 wherein said pattern further comprises a via pattern whereupon said imaging and development steps simultaneously create vias and micropores in said photoprocessable material.

17. The process of claim 12 wherein said micropores are fractal micropores.

18. The process of claim 12 wherein said photoprocessable material comprises an ethylenically unsaturated monomer, a polymerization initiator activatable by actinic radiation, at least one preformed, water-soluble, polymeric binder, and a particulate inorganic filler transparent to actinic radiation.

19. The process of claim 18 wherein said filler is chemically bonded to said binder.

20. A process for preparing a printed wiring board comprising the steps of forming a microporous via layer from a photoprocessable material by creating micropores in the photoprocessable material;

forming a circuit layer on said via layer; and contacting sa n circuit layers with a metal plating solution reaction conditions sufficient to deposit metal on the portions of said via layer, but not circuit layer, exposed to said plating solution.

21. The process of claim 20 wherein said via layer is treated with a reactive coupling agent to chemically bond said agent to the surface of said via layer.

22. The process of claim 21 wherein said coupling agent comprises an organotitanate, organozirconate, organosilane, or a combination thereof.

23. The process of claim 21 wherein said coupling agent is capable of catalyzing the deposition of metal on the exposed portions of said via layer.

24. The process of claim 20 wherein said via layer comprises a moderately hydrophilic photoprocessable material and said circuit layer comprises a moderately hydrophobic photoprocessable material.

25. The process of claim 24 wherein the wetting tension of said hydrophilic photoprocessable material is at least 52 dynes/cm.

26. The process of claim 24 wherein the wetting tension of said hydrophobic photoprocessable material is less than 40 dynes/cm.

27. The process of claim 20 wherein said photoprocessable material from which said microporous via layer is formed comprises an ethylenically unsaturated monomer, a polymerization initiator activatable by actinic radiation, at least one preformed, water-soluble, polymeric binder, and a particulate inorganic filler transparent to actinic radiation.

28. The process of claim 27 wherein said filler is chemically bonded to said binder.

29. The process of claim 27 wherein said filler particles are coated with a catalyst.

30. The process of claim 20 wherein said circuit layer comprises the polymerized product of a monomer which is a half acryloyl ester of bisphenol A epoxy monomer, a polymerization initiator activatable by actinic radiation, and at least one preformed elastomeric polymeric binder that is substantially free of acidic groups.

31. The process of claim 20 wherein said circuit layer comprises the polymerized product of a monomer which is a half acryloyl ester of bisphenol A epoxy monomer, a polymerization initiator activatable by actinic radiation, and at least one preformed elastomeric polymeric binder that is substantially free of acidic groups; and said photoprocessable material from which said microporous via layer is formed comprises an ethylenically unsaturated monomer, a polymerization initiator activatable by actinic radiation, at least one preformed, water-soluble, polymeric binder, and a particulate inorganic filler transparent to actinic radiation.

32. The process of claim 31 wherein, in said photoprocessable layer from which said microporous via layer is formed, said filler is chemically bonded to said binder.

33. The process of claim 31 wherein said circuit layer further comprises an acrylated urethane.

34. The process of claim 20 wherein said via layer is mass-seeded with catalyst particles prior to formation of said circuit layer.

35. The process of claim 20 wherein said via layer is selectively seeded with catalyst particles subsequent to formation of said circuit layer.

36. The process of claim 20 wherein said micropores are fractal micropores.

37. The process of claim 20 wherein said via layer comprises two layers of a microporous photoprocessable material separated by a layer of woven fabric.

38. The process of claim 37 wherein said woven fabric comprises a material capable of bonding to said photoprocessable material and having a refractive index that substantially matches the refractive index of said photoprocessable material.

39. The process of claim 37 wherein the thickness of the uppermost layer of said photoprocessable material is less than the diameter of the micropores formed in said material.

40. The process of claim 20 wherein micropores are formed in said via layer by overlaying said photoprocessable material with a mask having a plurality of dots, the diameter of said dots being selected to create micropores having a predetermined diameter;

exposing said photoprocessable material through said mask to a source of radiation; and developing the exposed areas of said photoprocessable material to create said micropores.

41. The process of claim 40 wherein the dots have diameters ranging from 5 to 30 microns and centers ranging from 12 to 60 microns.

42. The process of claim 40 wherein said mask further comprises a via pattern whereupon exposure and development simultaneously create vias and micropores in said photoprocessable material.

43. The process of claim 20 wherein micropores are formed in said via layer by preparing a digital representation of a pattern comprising a plurality of dots, the diameter of said dots being selected to create micropores having a predetermined diameter;

applying a layer of unexposed, undeveloped photographic imaging film to said photoprocessable material that is sensitive to a different spectrum of energy from said photoprocessable material or is differentially sensitive to the same spectrum of energy;

selectively exposing said film with an automatic photoplotter controlled by said digital representation to activate said film without affecting the underlying layer of photoprocessable material;

developing said film;

exposing said photoprocessable material through the image developed in said film as an in situ mask; and developing the exposed areas of said photoprocessable material to create said micropores.

44. The process of claim 43 wherein the dots have diameters ranging from 5 to 30 microns and centers ranging from 12 to 60 microns.

45. The process of claim 43 wherein said pattern further comprises a via pattern whereupon exposure and development simultaneously create vias and micropores in said photoprocessable material.

* * * * *

UNITED STATES PATENT AND TRADEMARK OFFICE
CERTIFICATE OF CORRECTION

PATENT NO. : 5,302,494
DATED : April 12, 1994
INVENTOR(S) : Paul E. Grandmont et al It is certified that error appears in the above-indentified patent and that said Letters Patent is hereby corrected as shown below:

```
Column 4, line 33, "pre" should be --are--.
Column 4, line 62, before "dry" delete one of the commas.
Column 5, line 25, "Micbler's" should be --Michler's--.
Column 6, line 26, after "the" delete the comma.
Column 7, line 24, "972" should be --1972--.
Column 7, line 55, after "build" delete one of the commas.
Column 8, line 25, "teach" should be --each--.
Column 8, lines 51 and 57, "rim" should be --nm--.
Column 12, claim 20, line 19, "sa n" should be --said via and--.
Column 12, line 21, after "not" insert --said--.
```

Signed and Sealed this

Twenty-sixth Day of September, 1995

Attest:

BRUCE LEHMAN

Attesting Officer

Commissioner of Patents and Trademarks